(12) United States Patent
Kohno

(10) Patent No.: US 6,198,117 B1
(45) Date of Patent: *Mar. 6, 2001

(54) TRANSISTOR HAVING MAIN CELL AND SUB-CELLS

(75) Inventor: Hiroshi Kohno, Tokyo (JP)

(73) Assignee: NEC Corporation, Tokyo (JP)

(*) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 08/806,422

(22) Filed: Feb. 26, 1997

(30) Foreign Application Priority Data

Feb. 28, 1996 (JP) .................................................. 8-041397

(51) Int. Cl.⁷ .......................... H01L 27/10; H01L 29/76; H01L 29/00; H01L 23/48
(52) U.S. Cl. .......................... 257/205; 257/401; 257/526; 257/786
(58) Field of Search .................................. 257/368, 401, 257/553, 786, 205, 517, 526, 272, 275, 280, 284

(56) References Cited

U.S. PATENT DOCUMENTS

| 5,440,153 | * | 8/1995 | Male et al. ............................ 257/205 |
| 5,598,347 | * | 1/1997 | Iwasaki .................................. 257/206 |

FOREIGN PATENT DOCUMENTS

| 62-112359 | * | 5/1987 | (JP) ...................................... 257/202 |
| 491455 | | 3/1992 | (JP) ...................................... 257/205 |
| 4-91455 | * | 3/1992 | (JP) ...................................... 257/205 |
| 7-66373 | * | 3/1995 | (JP) ...................................... 257/206 |

* cited by examiner

Primary Examiner—Steven H. Loke
(74) Attorney, Agent, or Firm—Sughrue, Mion, Zinn, Macpeak & Seas, PLLC

(57) ABSTRACT

A transistor formed in a master slice manner is disclosed for use in radio frequency range, the transistor includes a main transistor cell operating as a smallest transistor in scale among a product group of transistors, and sub-transistor cells are arranged at symmetrical positions with the main transistor cell as the center. The sub-transistor cells are connected in common or not to the main transistor in a master slice manner in accordance with the required characteristics.

8 Claims, 9 Drawing Sheets

TRANSISTOR HAVING MAIN CELL AND SUB-CELLS

BACKGROUND OF THE INVENTION

The present invention relates to a semiconductor device and, more particularly, to a transistor of a master-slice type applied to use in high or radio frequency (RF).

In order to realize an RF bipolar transistor in a master-slice type IC, such a method has been conventionally employed that a plurality of transistor cells having different numbers of emitter electrodes (hereinafter referred to as "a finger number") are arranged in one semiconductor chip, and those transistor cells having required finger number among them are used or adjacent transistor cells having different finger number are combined in use.

This method will be explained in more detail with reference to FIG. 7 to FIG. 9. Here, FIG. 7 and FIG. 8 show plan views of semiconductor chips of conventional semiconductors formed according to master slice approach, and FIG. 9 shows plan views when this semiconductor chip is connected to lead wires of a lead frame.

As shown in FIG. 7(a), a first transistor cell 102, a second transistor cell 103 and a third transistor cell 104 are formed in predetermined respective regions of a semiconductor chip 101. Although not shown, these transistor cells 102–104 are bipolar transistors having an emitter, a base and a collector, respectively, and the finger numbers of these transistors are different from one another. Namely, those transistors 102–104 are formed so as to have different size from one another. Note that slanting lines are shown in these transistor cells for the purpose of clarifying the arrangement in the semiconductor chip.

In such a semiconductor chip in which transistor cells 102–104 are arranged, a plural sorts of transistors are manufactured by varying the number of used transistor cells and the electrode configurations as shown in FIG. 7(b), FIG. 7(c), or FIG. 8(a), FIG. 8(b) and so on conforming to RF characteristics and current values fitting the use purpose.

In one configuration as shown in FIG. 7(b), bonding pads 105 and 106 are connected to the first transistor cell 102 through interconnection lines, respectively. Here, the bonding pad 105 is connected to the emitter of the first transistor cell 102 and the bonding pad 106 is connected to the base of the first transistor cell 102. An electrode of the collector is drawn out of the back of the semiconductor chip 101.

In another configuration as shown in FIG. 7(c), bonding pads 107 and 108 are connected to the first transistor cell 102 and the second transistor cell 103 through interconnection lines, respectively. The bonding pad 107 is connected in common to the emitters of the first transistor cell 102 and the second transistor cell 103, and the bonding pad 108 is connected in common to the bases of the first transistor cell 102 and the second transistor cell 103. The electrode of the collector is also drawn out of the back of the semiconductor chip 101.

In a still another configuration as shown in FIG. 8(a), bonding pads 109 and 110 that are common to the first transistor cell 102, the second transistor cell 103 and the third transistor cell 104 are formed in a similar manner. The bonding pad 109 serves as an emitter electrode, and the bonding pad 110 serves as a base electrode. The collector electrode is also provide on the back side of the semiconductor chip 101.

FIG. 8(b) shows a case in which two bonding pads 111 and 112 are connected to the same emitter. Namely, bonding pads 111 and 112 are connected to the emitters of the first transistor cell 102 and the second transistor cell 103 through interconnections. Further, a bonding pad 113 is connected to the bases of the first transistor cell 102 and the second transistor cell 103 through interconnections. The electrode of the collector is also drawn out of the back of the semiconductor chip 101.

Thus, in the above approach, the positions of the respective bonding pads are different from one another depending on the sort of products.

In an assembly, as shown in FIG. 9(a) applied to the semiconductor chip of FIG. 7(b), the bonding pad 105 of the semiconductor chip 101 is connected to an external emitter lead 115 by a bonding wire 114, and the bonding pad 106 is connected to an external base lead 117 by a bonding wire 116. The semiconductor chip 101 is mounted on a collector lead 118. On the other hand, in the device as shown in FIG. 9(b) applied to the chip of FIG. 8(a), the bonding pad 109 of the semiconductor chip 101 is connected to the emitter lead 115 by a bonding wire 119, and the bonding pad 110 is connected to the base lead 117 by a bonding wire 120.

Thus, the lead frame as shown in FIG. 9 can be used for the chips shown in FIGS. 7(b) and 8(a). However, this lead frame is not applicable to the chip shown in FIG. 8(b). This is because, two wires from the pads 111 and 112 are so close to each other that a bonder cannot perform an bonding operation.

Further, in the above approach, the position of the bonding pad varies every time the sort is different, i.e., every time the number of transistors used and the combination thereof are varied. As described in FIG. 9(a) and FIG. 9(b), it is comprehended that the bonding pad position becomes different case by case. Namely, there has been such a problem that positioning of bonders becomes necessary every time the assembled products are switched over one another at time of bonding, thus lowering assembly efficiency. Further, no influence is exerted upon RF characteristics when a transistor is used in a low frequency band since one wavelength of the used frequency is long. When it is used in a high frequency band in giga-cycle order such as an L band (1 to 2 giga-Hz band), however, when the distance of drawing out the electrode up to the bonding pads of respective transistor cells is different, a plurality of RF waves having different phases are applied to bonding pads where output is produced, which has caused lowering of power gain or deterioration of frequency characteristics of a transistor sometimes. Further, since the bonding wire length is different for every assembly product, when device parameters required when a module using these transistors or the like is designed are extracted, it has been required to extract the device parameters for every sort at transistor portions and other portions than those portions, thus showing poor design efficiency. Furthermore, when the electrode drawing out configuration differs between either side, the impedance and parasitic capacity values for respective transistors become different. In addition, calorific values at time of operations are different and junction temperatures become different by the different among respective transistor sizes. Thus, there has been such a problem that base to emitter voltage becomes different for every transistor cell and the operating point of the transistor as a semiconductor chip is shifted, thus causing lowering of a power gain and deterioration of frequency characteristics.

SUMMARY OF THE INVENTION

It is therefore an object of the present invention to provide an improved semiconductor device of a master slice type adoptable to use in RF range.

A semiconductor device according to one aspect of the present invention is provided as a transistor formed in a master slice manner, in which a transistor that shows the smallest scale among a product group of transistors manufactured according to master slice approach is arranged at the central part of the semiconductor chip as a principal transistor cell, and sub-transistor cells are arranged at positions that are symmetrical on the semiconductor chip putting the principal transistor cells therebetween.

It is convenient that a plurality of bonding pads are arranged on left and right in symmetrically with respect to the center line of the semiconductor chip.

With the above construction, the symmetric property of arrangement on a semiconductor chip of such transistor cells and bonding pads on a semiconductor chip improves the manufacturing efficiency of a transistor product group that becomes to be formed according to master slice approach by a large margin. Furthermore, this symmetric property becomes to uniformalize calorific values on the semiconductor chip at time of operation of the transistor.

BRIEF DESCRIPTION OF THE DRAWINGS

The above and other objects, advantages and features of the present invention will be more apparent from the following description taken in conjunction with the accompanying drawings, in which:

FIG. 2 is a sectional view of a transistor cell taken along line 2—2 of FIG. 1a;

DETAILED DESCRIPTION OF THE PREFERRED EMBODIMENTS

Figure 1A:
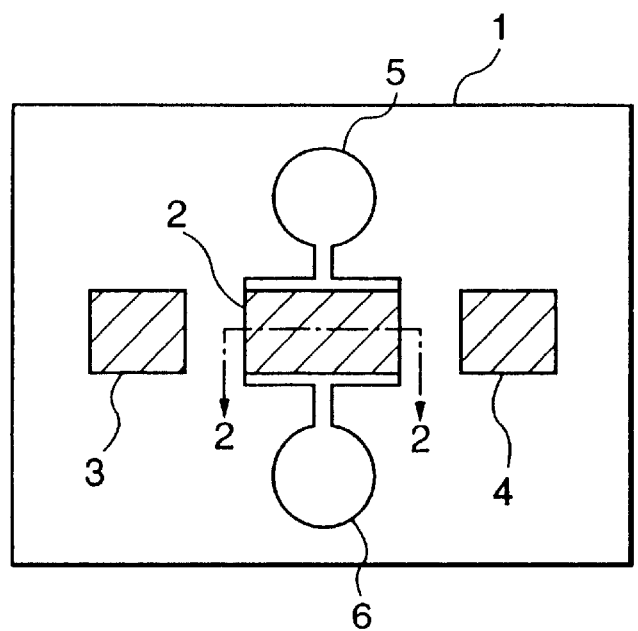
FIGS. 1(a) and 1(b) are plan views of a semiconductor chip for explaining a first embodiment of the present invention.

Referring now to FIG. 1, a device according to an embodiment of the present invention has a semiconductor chip 1, a central portion of which a principal or main transistor cell 2 is provided in. On the both sides of the transistor 2, sub-transistor cells 3 and 4 are arranged in symmetry. The principal transistor cell 2 is used as a smallest transistor among the product group manufactured according to master slice approach. On the other hand, the sub-transistor cells 3 and 4 are used to constitute a larger or largest transistor among the product group manufactured according to master slice approach by being added to the principal transistor cell 2.

Each of the transistor cells 2 to 4 is composed of one or a plurality of unit transistor having a predetermined size structure. Further, in the arrangement of these transistors, the sizes of the sub-transistor cells 3 and 4 are set so as to be smaller than the size of the transistor cell 2.

In the semiconductor chip thus constructed, a plurality of sorts of transistors are manufactured by varying the number of the actually used transistor cells according to the RF characteristics and/or a power required. For example, an RF transistor as shown in FIG. 1(a) is composed only of the main transistor cell 2, whereas an RF transistor as shown in FIG. 1(b) is composed of all the transistor cells 2–4.

Figure 1B:
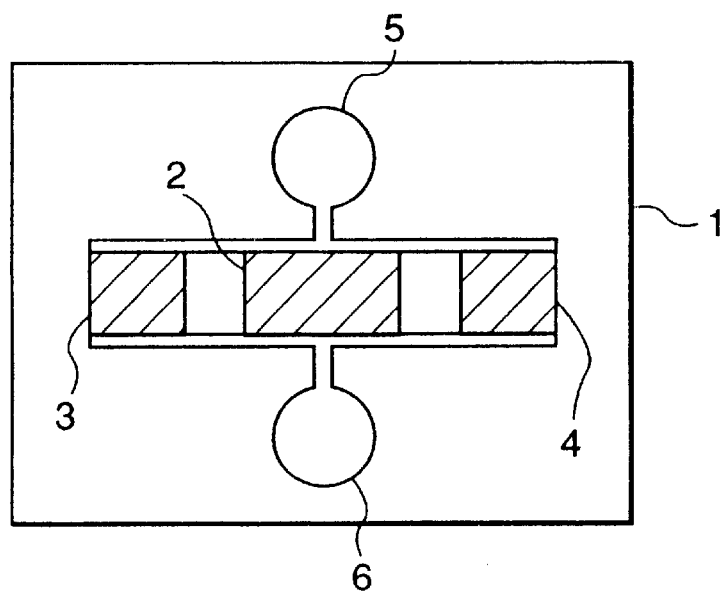

More specifically, in FIG. 1(a), bonding pads 5 and 6 are connected to the main transistor cell 2 through interconnection lines, in which the bonding pad 5 is connected to the emitter of the main transistor cell 2 and the bonding pad 6 is connected to the base of the principal transistor cell 2. Although not shown, a collector electrode is provided on the back surface of the semiconductor chip 1. In FIG. 1(b), on the other hand, the bonding pad 5 is connected in common to the emitters of the main transistor cell 2 and the sub-transistor cells 3 and 4 through an interconnection line, and the bonding pad 6 is connected in common to the bases of the principal transistor cell 2 and the sub-transistor cells 3 and 4 through another interconnection line. Moreover, each of the bonding pads 5 and 6 is provided on the same positions as each other in FIGS. 1(a) and 1(b) even when the sort of product is changed.

Figure 2:
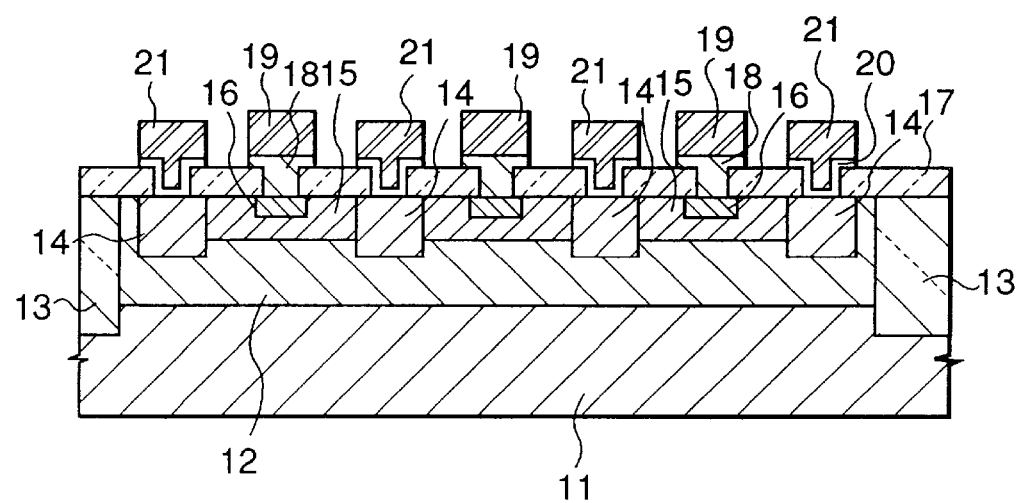

Turning to FIG. 2, the main transistor cell 2 is comprise of three unit transistor cells having a common collector region. Specifically, $N^-$ type epitaxial layer 12 is formed on an $N^+$ type silicon substrate 11. The layer 12 is divided into a three regions by dielectric isolation films 13. Note that FIG. 2 shows one of the three regions which functions as a collector region of the main transistor cell 2. In order to form three unit transistor cells, $P^+$ type diffused regions 14 are formed to serve as a graft base, P type base regions 15 are formed, and three $N^+$ type emitter regions 16 are formed. These $P^+$ type diffused region 14, $P^+$ type base region 15 and $N^+$ type emitter region 16 are formed so that their plan configurations show strip shapes.

A dielectric isolation film 17 is formed, and contact holes are provided in the dielectric isolation film 17 on the $P^+$ type diffused regions 14 and the $N^+$ type emitter regions 16. $N^+$ type polysilicon 18 is formed to be connected to the $N^+$ type emitter regions 16 through these contact holes. The emitter regions 16 are connected to the $N^+$ type polysilicon 18. As metal electrodes, a barrier metal 20 is formed to be connected to the $P^+$ type diffused regions 14 and base electrodes 21 are formed to be connected to the barrier metal 20. Both of the emitter electrode 19 and the base electrode 21 thus formed have a plan shape in a strip shape. Three lines of emitter electrodes 19 shown in FIG. 2 are connected in a comb shape in a plan configuration. Similarly, four lines of base electrodes 21 are also connected in a comb shape. Here, the number of the emitter electrodes 19 shown in FIG. 2 is the finger number described previously. In this case, the finger number is three.

Figure 3A:
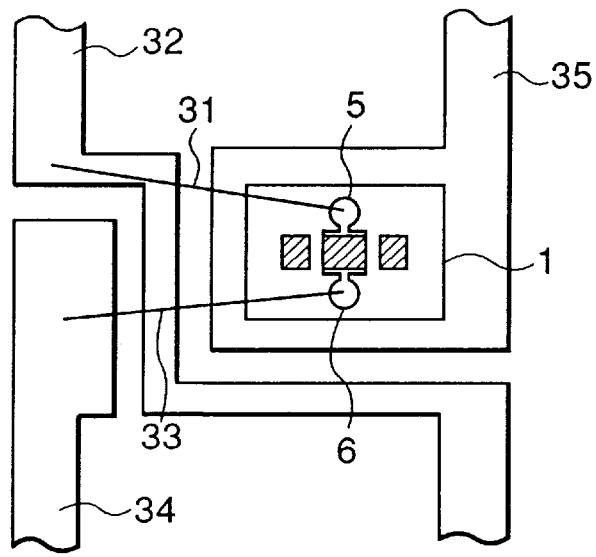
FIGS. 3(a) and 3(b) are plan views of a lead frame to which the semiconductor chip is connected.

In an assembly as an RF transistor, as shown in FIG. 3(a) applied to the semiconductor chip of FIG. 1(a), the emitter bonding pad 5 is connected to an emitter lead 32 by a bonding wire 31, and the base bonding pad 6 is connected to a base lead 34 with a bonding wire 33. The semiconductor chip 1 is mounted on a collector lead 35 to connect the collector electrode thereto.

Figure 3B:
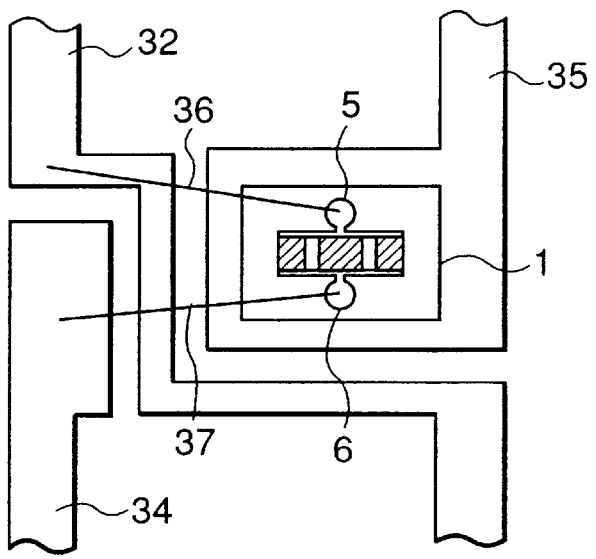

In an RF transistor for the chip of FIG. 1(b), as shown in FIG. 3(b), the emitter bonding pad 5 of the semiconductor chip 1 is connected to the emitter lead 32 with a bonding wire 36, and the base bonding pad 6 is connected to the base lead 34 with a bonding wire 37.

As is apparent from FIGS. 3(a) and 3(b), the bonder is free from requirement that bonding operation is switched from the FIG. 1(a) device to FIG. 1(b) device, thus improving assembly efficiency. Further, since the bonding pad position and the bonding wire length are the same even when the product sort is different in the present invention, those parameters that originate in the wire can be used in common at time of device parameter extraction, and it is sufficient to extract only the parameters of respective transistor portions, thus making it possible to shorten the time required for design and improving the design efficiency.

In the present invention, the sub-transistor cells 3 and 4 are arranged so that it becomes symmetrical left and right about the center of the semiconductor chip. As a result, the transistor characteristic is improved in the RF range.

This effect will be described with reference to FIG. 4 which shows the relationship between an input power Pin and an output power Pout. Note that the transistor is a vertical NPN transistor, in which a power supply voltage Vcc is 3 V and an operating frequency f is 1.9 giga Hz. The power is expressed in dBm.

Figure 4:
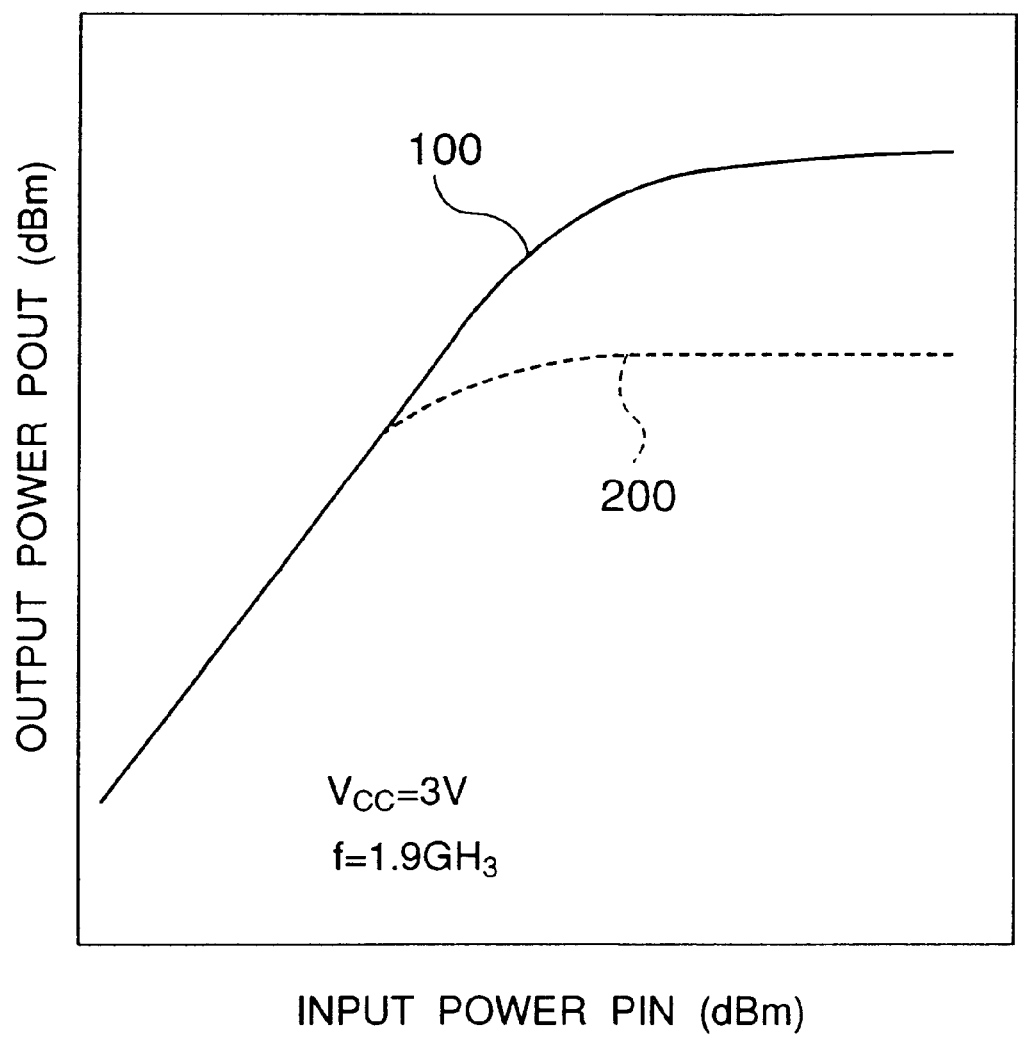
FIG. 4 is a graph showing an RF characteristic of a transistor for explaining effects of the present invention.
Figure 8A:
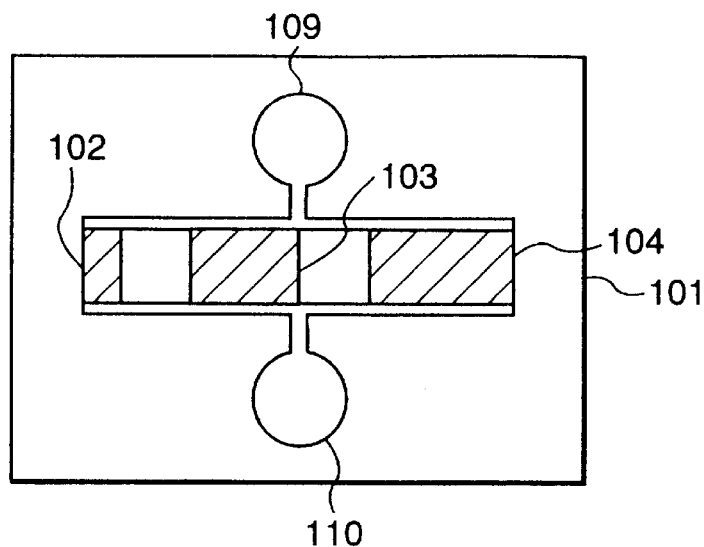
FIGS. 8(a) and 8(b) are plan views of a semiconductor chip for explaining a prior art.

In FIG. 4, a curve 100 indicates the result obtained by an RF transistor as shown in FIG. 1(b) is shown, and a curve 200 indicates the result obtained by an RF transistor as shown in FIG. 8(a). It should be noted that the sizes of the both transistor are structured to be the same.

Figure 8B:
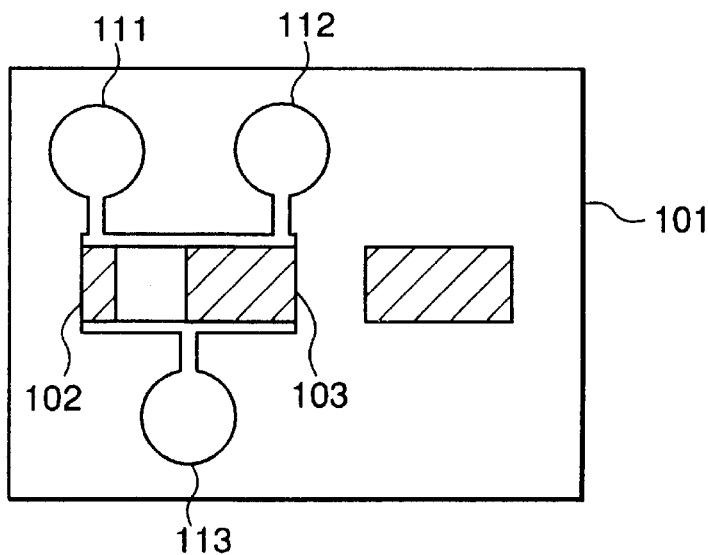
Figure 9A:
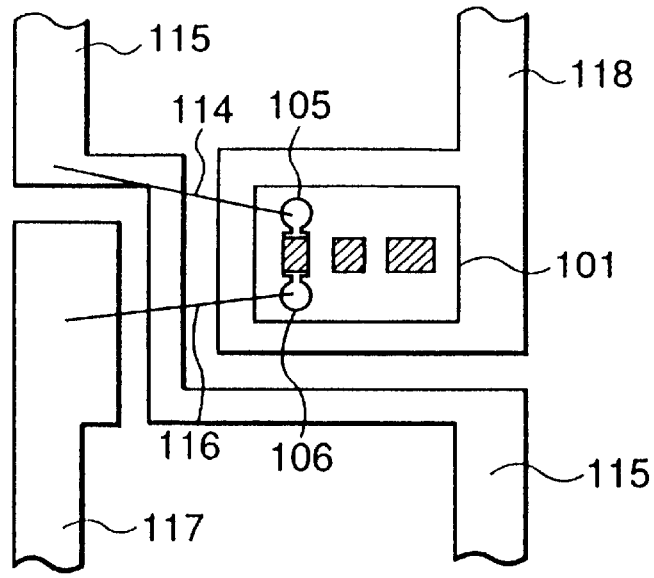
FIGS. 9(a) and 9(b) are plan views of a lead frame to which a semiconductor chip of a prior art is connected.
Figure 9B:
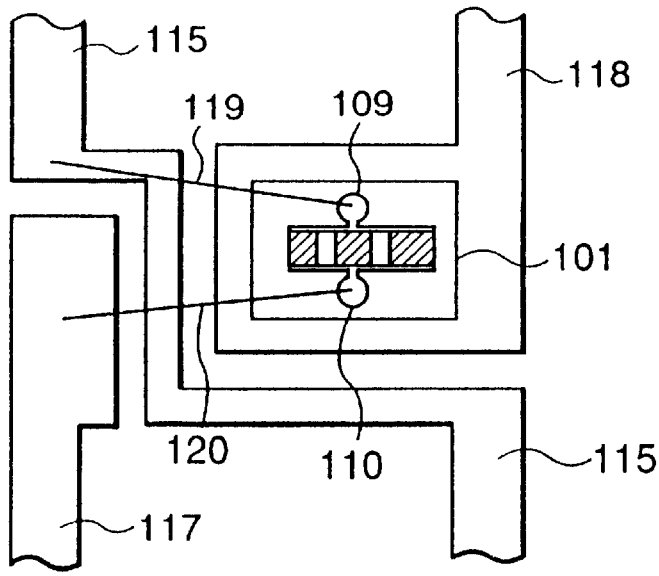

As is comprehended from FIG. 4 that, when the input power is increased, the output power is also increased in proportion to the increase. Then, when the power reaches a certain level or higher, the increased portion of the output power becomes smaller and the output power is saturated. In the case of the FIG. 1(b) transistor as indicated by the curve 100, the region where the output power is increased proportionally becomes higher than the case of the FIG. 8(b) transistor as indicated by the curve 200, and the saturated value of the output power, i.e., the saturation power is increased. In this manner, in the case of the present invention, the transistor becomes to operate up to a power region higher than the case of a prior art. The gain of the transistor is obtained by subtracting the input power (dBm) value from the output power (dBm) value in FIG. 4. Accordingly, the FIG. 1(b) transistor has higher gain than the FIG. 8(a) transistor.

In the case of the present invention, the calorific power generated in transistor operation gets comparatively high at the central part of the semiconductor chip, and gets lower point-symmetrically toward the circumference thereof. Further, heat generated in the transistor operation is radiated from the center of the semiconductor chip toward the circumference thereof. As the result of the above, heat generated in the transistor operation becomes to be distributed almost evenly on the semiconductor chip, and the temperature at time of operation of the semiconductor chip is leveled and lowered. Thus, the heat loss of the transistor is decreased and such an effect as described with reference to FIG. 4 becomes to be produced. Furthermore, thermorunaway of the transistor also becomes to be evaded.

As against the above, in the case of a prior art, heat generated in transistor operation gets higher in a prejudiced region of the semiconductor chip. For example, heat generation is increased in the third transistor cell 104 described with reference to FIG. 8(a). In this case, since the center of high heat generation is prejudiced toward the circumference of the semiconductor chip, heat radiation is stopped to be made evenly on the semiconductor chip. Then, extensive unevenness is generated in the temperature at time of operation of the semiconductor chip, and the temperature gets very high at a part and gets lower than the case of the present invention at another part. Here, in the transistor in the region where the temperature gets very high, heat loss becomes abnormally serious and the operation in the high region such as described with reference to FIG. 4 becomes difficult. In this case, thermorunaway of the transistor is liable to occur.

Next, the description will be made on a second embodiment of the present invention with reference to FIG. 5 and FIG. 6. The configuration of the present embodiment shows a case when two bonding pads for an emitter are formed.

Figure 5A:
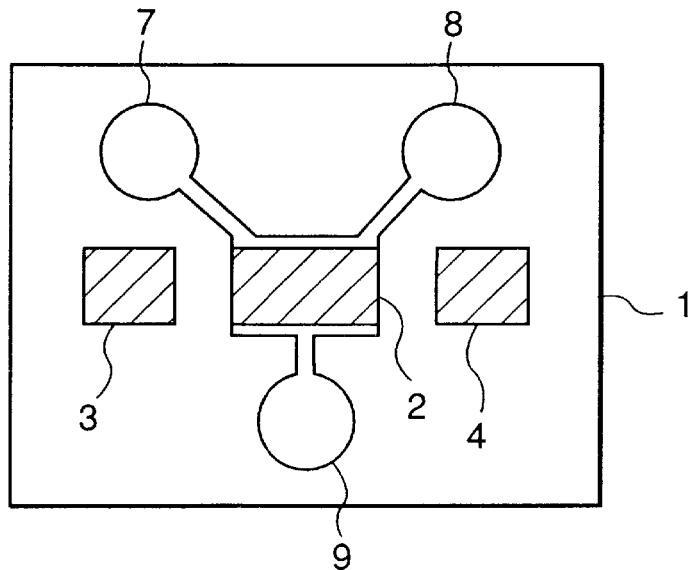
FIGS. 5(a) and 5(b) are plan views of a semiconductor chip for explaining a second embodiment of the present invention.

Similarly to the first embodiment, as shown in FIG. 5(a), a principal transistor cell 2 is provided in a central region of a semiconductor chip 1, and sub-transistor cells 3 and 4 are arranged at symmetric positions on both sides of the principal transistor cell 2. Here, the principal transistor cell 2 is composed of the smallest transistor among the product group manufactured according to master slice approach. Further, the sub-transistor cells 3 and 4 are formed so as to constitute the largest transistor among the product group manufactured according to master slice approach adding the principal transistor cell 2.

As shown in FIG. 5(a), bonding pads 7 and 8 are connected to the emitter of the principal transistor cell 2. Further, a bonding pad 9 is connected to the base of the principal transistor cell 2. Furthermore, the electrode of the collector is drawn out of the back of the semiconductor chip 1.

Figure 5B:
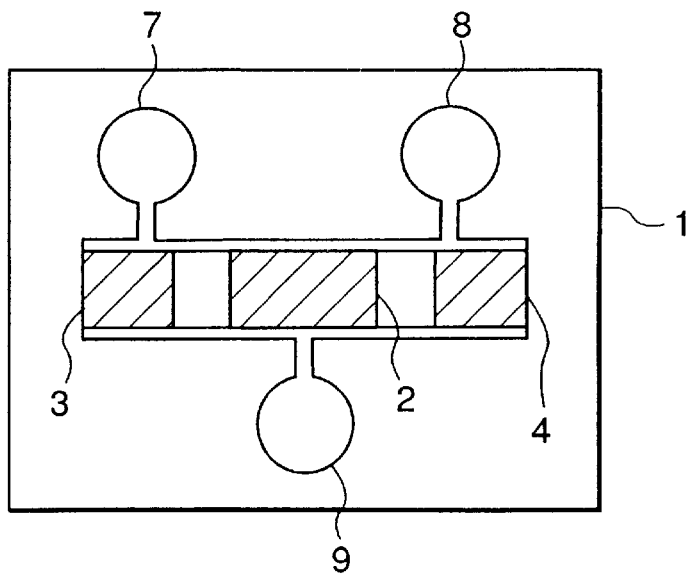

As shown in FIG. 5(b), bonding pads 7 and 8 are connected to emitters of the principal transistor cell 2 and the sub-transistor cells 3 and 4. Further, a bonding pad 9 is connected to the bases of the principal transistor cell 2 and the sub-transistor cells 3 and 4. In this case, the electrode of the collector is also drawn out of the back of the semiconductor chip 1.

In the case of a semiconductor chip made according to master slice approach having two bonding pads connected to the emitter such as described above, the positions of bonding pads are also set so that these positions become the same in the semiconductor chips among the products.

Figure 6A:
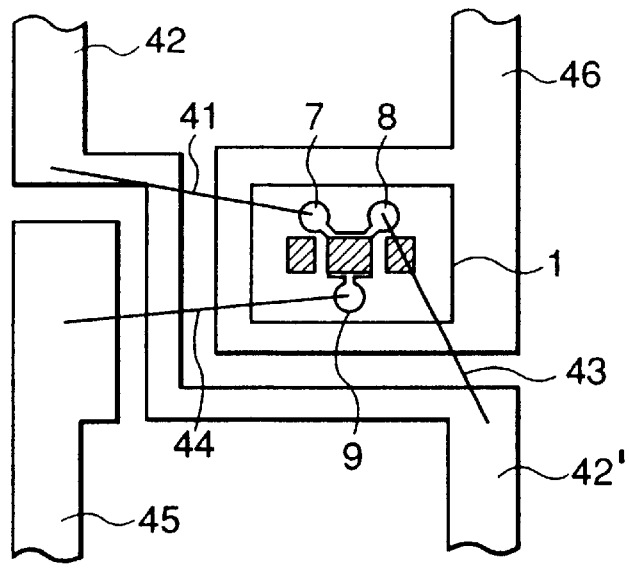
FIGS. 6(a) and 6(b) are plan views of a lead frame to which the semiconductor chip is connected.

When a semiconductor chip explained with respect to FIG. 5(a) is sealed to a lead frame, a bonding pad 7 for an emitter of the semiconductor chip 1 is connected to a lead 42 with a bonding wire 41 as shown in FIG. 6(a). Similarly, a bonding pad 8 for the emitter is also connected to a lead 42' with a bonding wire 43. Here, the lead 42 and the lead 42' are formed as one line of lead. Furthermore, a bonding pad 9 for a base is connected to a lead 45 with a bonding wire 44. Further, the semiconductor chip 1 is mounted on a lead 46 and connected thereto.

Figure 6B:
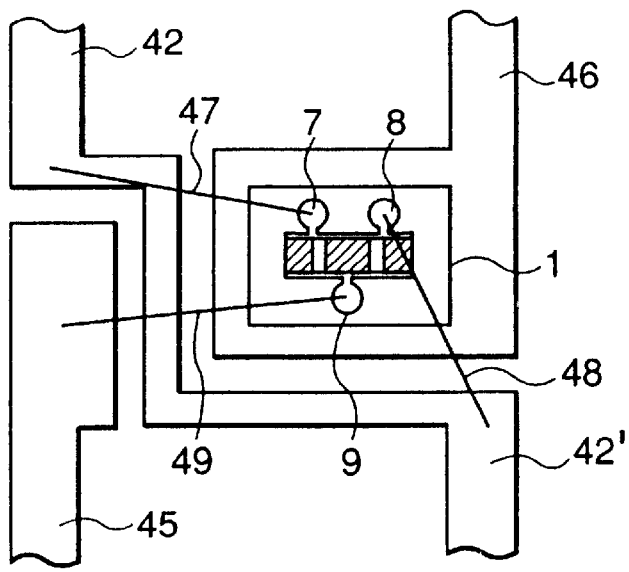
Figure 7A:
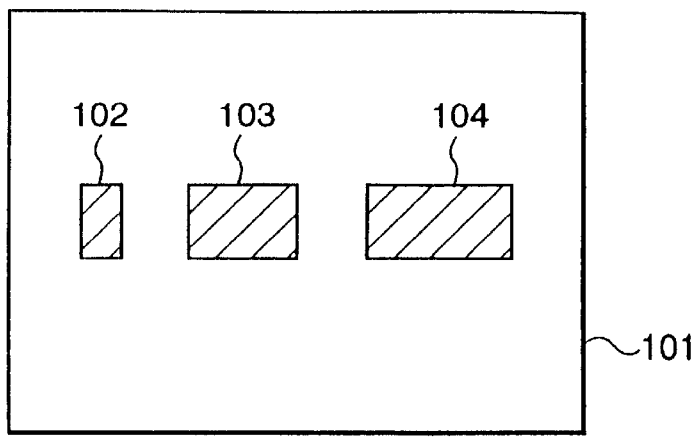
FIGS. 7(a) to 7(c) are plan views of a semiconductor chip for explaining a prior art.
Figure 7B:
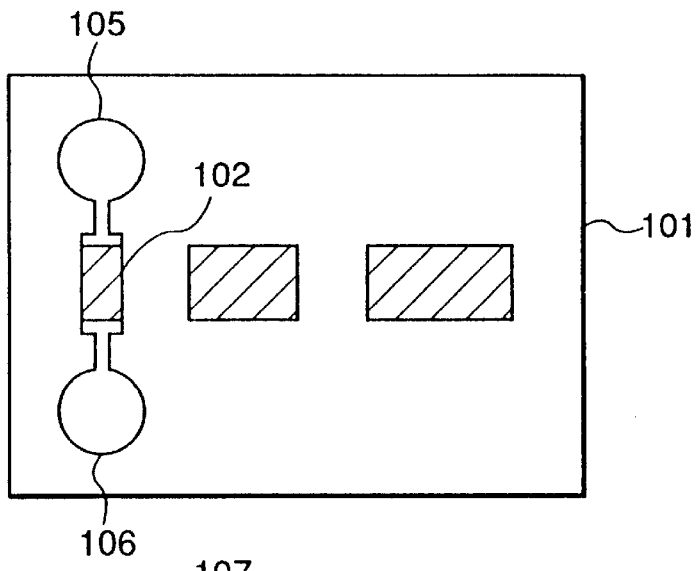
Figure 7C:
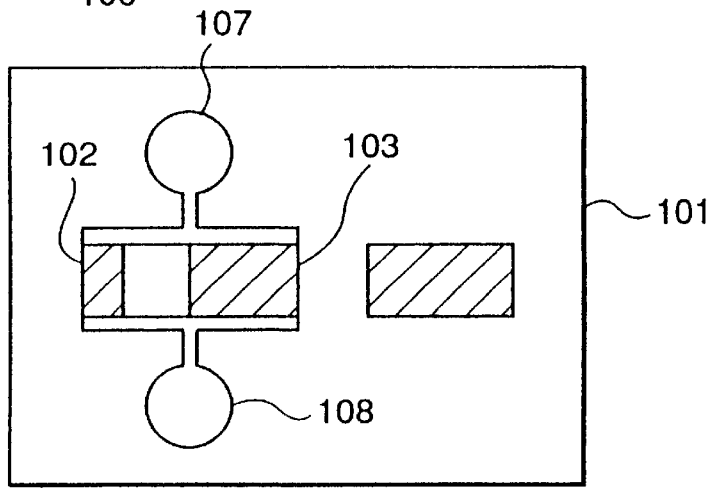

In the case of the semiconductor chip shown in FIG. 5(b), wire bonding is made also in an exactly same manner as the case of the semiconductor chip shown in FIG. 5(a). Namely, as shown in FIG. 6(b), the bonding pad 7 for the emitter of the semiconductor chip 1 is connected to the lead 42 with a bonding wire 47. Similarly, the bonding pad 8 for the emitter is also connected to the lead 42' with a bonding wire 48. Furthermore, a bonding pad 9 for a base is connected to the lead 45 with a bonding wire 49. Further, the semiconductor chip 1 is mounted on a lead 46 and connected thereto.

In an RF transistor such that the present invention is applied, the inductance originated in the bonding wire becomes smaller as the wire diameter is increased when the wire length is fixed. Therefore, when two bonding pads for the emitter are provided and connected to the lead with two lines of bonding wires as the second embodiment, the inductance becomes approximately ½ as compared with a case of one line of bonding wire. In particular, since the inductance on the emitter side exerts a great influence on the RF characteristic of a transistor, the effect by reduction of inductance becomes larger.

Further, by making the transistor cell arrangement and the bonding pad arrangement on the semiconductor chip identical to each other, positioning every time the assembly product sort is changed in bonding becomes unnecessary, and the assembly efficiency is improved. Further, since the interconnection length of respective transistor cells becomes equal in the semiconductor chip, the impedance, the parasitic capacity value or the like for respective transistor cells becomes equal, and the balance within the transistor is improved. Furthermore, the thermal balance within the chip is also improved by arranging a large transistor cell at the center and arranging small transistor cells on both sides thereof evenly in the semiconductor chip. Thus, lowering of the power gain and deterioration of the frequency characteristic do no longer occur. Furthermore, by adopting a plurality of bonding pads, the inductance is decreased and the frequency characteristic is improved. In addition, parameters originated in wires can be used in common at time of extraction of device parameters because the bonding pad positions and the bonding wire length are the same even when the product sort is different. Thus, it is sufficient to extract only the parameters at respective transistor portions, the time required for design is shortened and the design efficiency is improved by a large margin.

In the above-mentioned embodiment, a case when one each piece of sub-transistor cell is arranged on either side of the semiconductor chip has been described. The present invention is not limited to such an example, but a plural pieces of sub-transistor cells may be formed on either side, respectively. In this case, however, it is preferred that the finger number of the transistor cells is set so as to decrease as approaching the circumference of the semiconductor chip.

Further, in the embodiment of the invention, a case that the transistor cell is composed of a bipolar transistor has been described. However, the present invention is also formed similarly with a MISFET or a MESFET as this transistor. In the case of such a field effect transistor, however, the finger number is to be considered as the number of source electrodes. Other points are to be considered similar to what has been described with respect to a bipolar transistor.

As described in detail above, deterioration of the RF characteristic of a transistor originated in the layout in a semiconductor chip is eliminated in an RF transistor according to master slice approach by means of the transistor cell arrangement and the bonding pad arrangement within a semiconductor chip as the present invention. Furthermore, improvement of RF characteristics such as high power gain or high power performance of an RF transistor can be expected.

Further, in respective products manufactured according to master slice approach, the assembly efficiency of a transistor is improved by a large margin by that the bonding pad positions and the bonding wire length become equal to one another. Further, the design efficiency of a hybrid circuit using such a transistor is improved.

It is apparent that the present invention is not limited to the above embodiments but may be changed and modified without departing from the scope and spirit of the invention.

What is claimed is:

1. A semiconductor device comprising:

a semiconductor chip, a principal transistor cell formed in said semiconductor chip, a first sub-transistor cell formed in said semiconductor chip, isolated from said principal transistor cell by a dielectric film, and disposed on a first side of said principal transistor cell; and a second sub-transistor cell formed in said semiconductor chip, isolated from said principal transistor cell by said dielectric isolation film, and disposed on a second side of said principal transistor cell, wherein said first and second sub-transistor cells are arranged in symmetry with respect to said principal transistor cell, and wherein said principal transistor cell consists of a plurality of identical unit transistors, and each of said sub-transistor cells consist of at least one said unit transistor, the number of said unit transistors constituting said principal transistor cell being larger than that of said at least one unit transistor constituting said each of said sub-transistor cells.

2. The device according to claim 1, wherein said first side of said principal transistor cell is at an opposite side of said second side of said principal transistor cell.

3. The device according to claim 1, wherein said principal transistor cell consists of a plurality of emitter electrodes, each of said sub-transistor cells consists of at least one emitter electrode, and the number of said emitter electrodes of said principal transistor cell is larger than that of said at least one emitter electrode of each of said sub-transistor cells.

4. The device according to claim 3, further comprising:

a first bonding pad connected in common to said emitter electrodes of said principal transistor cell.

5. The device according to claim 3, further comprising:

a first bonding pad connected in common to said emitter electrodes of said principal transistor cell and each of said sub-transistor cells.

6. The device according to claim 3, further comprising:

a first bonding pad connected in common to said emitter electrodes of said principal transistor cell;

a second bonding pad connected in common to said emitter electrodes of said principal transistor cell, wherein said first bonding pad and second bonding pad are arranged in symmetry with respect to said principal transistor cell.

7. The device according to claim 3, further comprising:

a first bonding pad connected in common to said emitter electrodes of said principal transistor cell and said sub-transistor cell;

a second bonding pad connected in common to said emitter electrodes of said principal transistor cell and second sub-transistor cell, wherein said first bonding pad and second bonding pad are arranged in symmetry with respect to said principal transistor cell.

8. The device according to claim 1, wherein said principal transistor cell is provided in a central portion of said semiconductor chip.

* * * * *

UNITED STATES PATENT AND TRADEMARK OFFICE
CERTIFICATE OF CORRECTION

PATENT NO. : 6,198,117 B1  
DATED : March 6, 2001  
INVENTOR(S) : Hiroshi Kohno

Page 1 of 1

It is certified that error appears in the above-identified patent and that said Letters Patent is hereby corrected as shown below:

Column 5,  
Line 44, delete "8(a)" insert -- 8 "b" --

Signed and Sealed this

Eighth Day of January, 2002

Attest:

Attesting Officer

JAMES E. ROGAN  
*Director of the United States Patent and Trademark Office*